United States Patent
Simoni et al.

(10) Patent No.: US 9,649,868 B2
(45) Date of Patent: May 16, 2017

(54) EXPANDED COLOR GAMUT

(71) Applicant: SUN CHEMICAL CORPORATION, Parsippany, NJ (US)

(72) Inventors: Michael Simoni, Huddersfield (GB); Gary Butler, Huddersfield (GB); Robert Deighton, Halifax (GB)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 14/413,979

(22) PCT Filed: Jul. 12, 2013

(86) PCT No.: PCT/US2013/050285
§ 371 (c)(1),
(2) Date: Jan. 9, 2015

(87) PCT Pub. No.: WO2014/011995
PCT Pub. Date: Jan. 16, 2014

(65) Prior Publication Data
US 2015/0158317 A1    Jun. 11, 2015

Related U.S. Application Data

(60) Provisional application No. 61/671,152, filed on Jul. 13, 2012, provisional application No. 61/774,006, filed on Mar. 7, 2013.

(51) Int. Cl.
*B41M 1/20* (2006.01)
*G03F 3/10* (2006.01)
(Continued)

(52) U.S. Cl.
CPC ............. *B41M 1/20* (2013.01); *C09D 11/322* (2013.01); *C09D 11/40* (2013.01); *G03F 3/10* (2013.01)

(58) Field of Classification Search
CPC ... B41F 3/44; B41F 3/42; B41M 1/14; B41M 1/16; B41M 1/20; H04N 1/54
See application file for complete search history.

(56) References Cited

U.S. PATENT DOCUMENTS 5,309,246 A * 5/1994 Barry ...................... H04N 1/52
358/1.9
5,689,349 A * 11/1997 Plettinck .............. H04N 1/6055
358/296

(Continued)

FOREIGN PATENT DOCUMENTS

| EP | 1413609 A1 | 4/2004 |
|---|---|---|
| EP | 2025725 A1 | 2/2009 |
| GB | 2367299 A | 4/2002 |

OTHER PUBLICATIONS

International Preliminary Report on Patentability for International Application No. PCT/US2013/050285 dated Jan. 13, 2015.
(Continued)

*Primary Examiner* — David Banh
(74) *Attorney, Agent, or Firm* — Charles C. Achkar; Ostrolenk Faber

(57) ABSTRACT

A method of extending the gamut of standard 4 color process printing is presented. The method thus yields various novel process printing ink sets. According to exemplary embodiments, an extended color gamut can be provided without requiring the addition of a sixth or seventh primary ink to the existing 4-color ink set. In some embodiments, an enhanced gamut can be achieved by changing the colors of the four basic primary inks and only adding a fifth primary ink. This may be done, for example, by shifting the hue of two or three of the CMY primaries and adding an additional primary. Using only five process inks thus provides, for example, the typical packaging printer with more open print stations for spot color printing or for overprint varnish application. In
(Continued)

another illustrative embodiment, a sixth process color may be added to the inventive five color ink set.

16 Claims, 7 Drawing Sheets

(51) Int. Cl.
*C09D 11/322* (2014.01)
*C09D 11/40* (2014.01)

(56) References Cited

U.S. PATENT DOCUMENTS

| | | | | |
|---|---|---|---|---|
| 5,734,800 | A * | 3/1998 | Herbert | H04N 1/54 358/1.9 |
| 5,812,694 | A * | 9/1998 | Mahy | H04N 1/6016 358/518 |
| 5,870,530 | A * | 2/1999 | Balasubramanian | H04N 1/54 358/1.1 |
| 5,892,891 | A * | 4/1999 | Dalal | H04N 1/54 358/1.9 |
| 5,933,256 | A | 8/1999 | Ebner | |
| 6,638,851 | B2 * | 10/2003 | Cowley | H01L 21/76802 257/E21.577 |
| 7,123,380 | B2 * | 10/2006 | Van de Capelle | H04N 1/54 345/501 |
| 7,164,498 | B2 * | 1/2007 | Van Bael | H04N 1/603 358/1.9 |
| 7,199,903 | B2 * | 4/2007 | Van de Capelle | G01J 3/46 358/1.9 |
| 7,535,596 | B2 * | 5/2009 | Spaulding | H04N 1/6022 358/1.9 |
| 7,898,692 | B2 * | 3/2011 | Wang | H04N 1/4058 358/1.9 |
| 2002/0057833 | A1 * | 5/2002 | Gill | H04N 1/54 382/162 |
| 2004/0114162 | A1 * | 6/2004 | McElvain | H04N 1/58 358/1.9 |
| 2005/0284329 | A1 | 12/2005 | Jackson et al. | |
| 2005/0284330 | A1 | 12/2005 | Jackson | |
| 2006/0082844 | A1 * | 4/2006 | White | H04N 1/54 358/504 |
| 2006/0170938 | A1 * | 8/2006 | Ibarluzea | H04N 1/54 358/1.9 |
| 2007/0002343 | A1 * | 1/2007 | Butterfield | H04N 1/54 358/1.9 |
| 2007/0002345 | A1 * | 1/2007 | Gondak | H04N 1/6022 358/1.9 |
| 2008/0068663 | A1 * | 3/2008 | Broddin | H04N 1/6052 358/3.24 |
| 2011/0242213 | A1 * | 10/2011 | Okada | B41J 2/155 347/40 |
| 2012/0090488 | A1 | 4/2012 | Postle | |
| 2012/0137906 | A1 * | 6/2012 | Pillard | G07B 17/00508 101/186 |

OTHER PUBLICATIONS

International Search Report mailed on Sep. 27, 2013 in connection with International Application No. PCT/US2013/050285.
European Search Report issued in European Application No. 13816891.9, dated Jan. 11, 2016.
European Communication re Supplementary and Extended Search Report issued in 13816891.9, dated Dec. 17, 2015.

* cited by examiner

EXPANDED COLOR GAMUT

CROSS REFERENCE TO RELATED APPLICATIONS

The present application is a §371 National Phase application based on PCT/US2013/050285 filed Jul. 12, 2013, which claims the benefit of U.S. Provisional Application No. 61/671,152 filed on Jul. 13, 2012 and 61/774,006 filed on Mar. 7, 2013, the subject matter of each of which is incorporated by reference in their entirety.

BACKGROUND OF THE INVENTION

Conventional Expanded Color Gamut Printing

Harold Boll, A Color to Colorant Transformation for a Seven Ink Process, presented at the IS &T-SPIE Symposium on Electronic Imaging, Science and Technology, SPIE vol. 2170, February 1994, describes the selection of primary color to obtain the desired color in a CMYKRGB apparatus. The disclosed technique subdivides the gamut formed by the seven possible colorants into smaller groupings. A series of four-colorant subsets from the seven-ink superset of CMYKRGB are individually characterized and a colorimetric transform was obtained for each subset. In color space, each of the four-colorant subsets represent adjacent and overlapping sub-gamut of the seven-colorant gamut.

Currently popular techniques for gamut enhancement, particularly in regard to ink-jet printing, include using primary color inks of different densities (e.g. a dark cyan ink and a light cyan ink), or adding orange and green primary inks (known as the Pantone "Hexachrome®" system).

The color gamut of a four-color printing process using CMYK is not very large, and therefore some colors cannot be reproduced using only CMYK. Thus, processes using more than four inks have been developed in order to increase the color gamut. These additional inks are not "spot colors" used to create special effects, like luminescent inks, but rather are high chroma, mono-pigmented, conventional inks. The additional inks are intrinsically part of the color separation process to create realistic images.

An example of printing with at least six inks is PANTONE's Hexachrome® system from PANTONE, Inc., Carlstadt, N.J., consisting of enhanced CMYK inks complemented with an Orange and a Green ink (CMYKOG). By providing an enhanced set of Cyan, Magenta, Yellow and Black, plus the addition of PANTONE Hexachrome® Orange and PANTONE Hexachrome® Green, the color gamut for reproducing printed photographic images and simulated spot colors has been substantially increased. Its large color gamut, compared to four-color process printing, makes it possible to more accurately reproduce a wide range of both vibrant and subtle colors that can be defined and displayed on computer monitors, which previously could not be duplicated in print. In addition to reproducing more brilliant continuous-tone images, Hexachrome is capable of accurately reproducing over 90% of the PANTONE MATCHING SYSTEM® Colors, almost twice the number that can be obtained using conventional four-color process printing, as shown at (http://th.pantone.com/pages/pantone/Pantone.aspx?pg=19303&ca=24).

Another example is known as Küppers' ink set that uses CMYK, a Red, a Green, and a Blue ink (CMYKRGB). H. Küppers: "Die Farbenlehre der Fernseh-, Foto-und Drucktechnik", Du Mont Verlag., Köln, 1985.

U.S. Pat. No. 5,309,246 describes a method for achieving an extended color gamut by printing halftones with varying solid ink density. Such variable density CMYK primaries would not be used to produce a balanced neutral appearance, but would be used to produce overprints with higher chroma or unique hue compared to standard CMYK overprints.

U.S. Pat. No. 5,689,349 describes how Pantone PMS® color can be substituted for one of the four standard process colors (CMYK) but discloses nothing regarding combining spot colors and process colors.

U.S. Pat. No. 5,734,800 describes how the gamut of four standard process colors (CMYK) can be expanded by adding two additional process colors (OG), known commercially as Pantone Hexachrome® (described above).

U.S. Pat. No. 5,751,326 describes a method for converting a scanned image in RGB space into a set of printing formes for a process ink set comprised of CMYKRGB inks. However, no mention is made as to how to convert an extended gamut process set into a spot color, or how to incorporate a spot color into an extended gamut process set. The process primaries are defined by reference to specific Pantone® PMS® color swatches.

U.S. Pat. No. 5,812,694 describes a colorant selection algorithm for a color reproduction device. The algorithm looks at a range of primary colors and selects all reasonable subsets of those primaries to yield the most stable match to a given spot or line color, a step used in producing the printing formes required to reproduce a spot color using a process set. However, once again, there is no discussion as to how to use a spot color as a substitute or extension to a given process color set.

U.S. Pat. No. 5,870,530 describes the use of a secondary set of process primaries in an extended gamut 7 color process set to enhance the gamut of the CMYK ink primaries by overprinting with the extra process ink set. The system is used to create printing formes that "fill" in the process regions of color space between the C and Y with overprints of the G process primary. It does not teach how to match spot colors with process colors or how to incorporate a spot color into the extended gamut process ink set. The printing forme is a virtual forme as the preferred embodiments are for digital electrophotographic printing devices.

U.S. Pat. No. 5,892,891, a continuation of U.S. Pat. No. 5,870,530 (described above), describes an exact algorithm for six or seven color process printing. Additionally, this patent describes how to reduce the number of process primaries from six or seven to multiple subsets of four inks so that traditional color separation techniques may be applied to creating the printing forme. This invention does not describe using spot colors in the process set.

U.S. Pat. No. 6,307,645 is a continuation of U.S. Pat. No. 5,870,530 in which a method for creating halftone screens for a six or seven color process set is described. The invention teaches how to print more than four primary inks without the need for additional halftone screening requirements by assigning one or more the screening properties of the CMYK ink set to the extra inks when used in combinations four inks at a time. Again, this does not describe spot colors or substituting spot colors into the process set. The described method suffers from the restriction that it is based on the use of virtual printing formes, as used in digital electrophotographic printing, where screen properties can be changed via digital computer codes. In a traditional packaging printing application using offset, flexographic or gravure printing technology, the printing forme is fixed for all print regions. Thus, for example, the O ink may use the M screen in one area of the image being printed and the C screen in a different area of the same image. While this is achievable in digital printing, it is simply not possible in conventional printing.

U.S. Pat. No. 6,530,986 discloses a set of six inks for inkjet printing based on pigments with improved light fastness and an extended gamut over traditional CMYK ink sets.

U.S. Pat. No. 6,637,851 describes another form of color separation algorithm using digital image data in place of the traditional continuous tone image data. The described technique relates to taking the process ink sets in pairs and statistically distributing the color over a predetermined area of the image, in a process known as super pixilation or dithering. This is a process used in traditional packaging known as FM screening and has been incorporated in branded processes such as, for example, FMsix®.

U.S. Pat. Pub. No. 2004/0114162 and EP 1364524 describe the FMsix® printing process where spot colors are matched with a hi-fi process set in which (i) the photographic image data are printed using traditional CMYK halftoning and (ii) logos and brand colors are printed using the extended gamut printing set and digital frequency modulation halftoning. The method is said to reproduce with an accuracy of 6 CIELAB color difference units 85% of all known spot colors. It does not teach the use of spot colors as the secondary set of extended gamut colors.

U.S. Pat. No. 7,123,380 describes the conversion of a color in an image defined in a 3 or 4 dimension color space (RGB or CMYK) into a color space defined by more than 4 dimensions or colorants. This is a color separation process that is based on mapping the gamut of colors of one color space into or onto the gamut of colors of the second and third color spaces. This approach is used to take a traditional CMYK image and move it to a digital proofing device that uses more than 4 primary colors to obtain a larger gamut for proofing. The described method does not discuss matching spot colors or using spot colors as the extended gamut colors.

U.S. Pat. No. 7,164,498 Color Matching for a Printing Process Using More than Four Colorants Using a Four-Colorant Color Management System, describes taking an RGB image and mapping it onto multiple output devices utilizing a variation of the ICC profile method. It is primarily a method for digital color separation involving a "Virtual CMYK" profile. This concept defines a printing system with an ideal, unattainable CMYK color gamut which is larger than either of the real CMYKOG or CMYKRGB extended gamuts. Then gamut compression is used to map the unreal CMYK onto the real extended gamut process primary set. No description is provided regarding spot colors or using spot colors in the process set.

U.S. Pat. No. 7,199,903 describes a method for numerical prediction of the color and appearance of a series of overprinted process primaries. This teaching applies to creating a printing forme that produces a combination of a range of process inks that will reproduce a desired color on a printing device. The teaching does not disclose or identify the matching of spot colors or the use of spot colors in the process set.

U.S. Pat. No. 7,535,596 describes a method for determining colorant control values for a color imaging device having four or more colorants is disclosed. The method includes defining a color mapping for a set of paths through a three-channel color space, defining a color mapping function for the three-channel color space relating the three-channel color space values to colorant control values for the four or more colorants of the color imaging device by interpolating between the color mapping defined for the set of paths, forming a forward three-channel color model relating the three-channel color space values to device-independent color values, inverting the forward three-channel color model to determine an inverse three-channel color model relating the device-independent color values to the three-channel color space values, and combining the inverse three-channel color model and the color mapping function to determine an inverse device color model.

U.S. Pat. No. 7,898,692 discloses a method and apparatus for moiré-free color halftone printing with up to five color image separations. The method and apparatus utilize a plurality of non-orthogonal halftone screens to produce outputs that are moiré free and form rosettes. The method and apparatus provide for defining a first and a second color halftone screen fundamental frequency vector for each of three halftone screens such that the halftone screen set output forms moiré-free rosettes; then defining a fourth color halftone screen where a first fundamental vector of the fourth screen shares a fundamental frequency vector with one of said three halftone screens and a second fundamental frequency vector of the fourth screen shares a fundamental frequency vector with a different one of said three color halftone screens; and further defining a fifth color halftone screen where a first fundamental vector of the fifth screen shares a fundamental frequency vector with one of said three halftone screens and a second fundamental frequency vector of the fifth screen shares a fundamental frequency vector with a different one of said three color halftone screens, and the neither of the fundamental frequency vectors of the fifth screen are equal to either of the fundamental frequency vectors of the fourth screen.

U.S. Pat. No. 7,990,592 discloses methods, systems and apparatus to manage spot colors for an image marking device. Specifically, disclosed is a spot color control method including selecting a gain matrix K from a plurality of gain matrices, the gain matrix K being selected to satisfy performance criteria associated with the rendering of the target spot color, the performance criteria including an acceptable spot color error associated with the rendered spot color relative to the target color, an acceptable actuator energy utilized to achieve the acceptable spot color error and a total toner/ink usage acceptable to render the spot color.

Similarly, U.S. Pat. No. 5,734,800 cites a printing process using six non-standard inks in which the black is a Pantone Process Black and the 3 to 5 colored inks are selected from a set of standard Pantone inks possessing a predetermined portion of fluorescence. The patent describes a preferred embodiment in which the magenta, an orange and a green all exhibit significant levels of fluorescence. While this non-standard ink set offers an enhanced gamut, it is well known to those skilled in the art that such colorants will be unstable with respect to quality of illumination, producing a dramatically different appearance under different sources of illumination. Again, this makes it difficult or impossible to achieve a near-neutral press calibration as the level of gray will change from one part of the printing plant to another or from indoors to outdoors.

U.S. Pat. No. 5,571,326 discloses a system and method for creating a color separation from an RGB camera or scanner image into a color space with 7 primary colors (CMYKRGB). The claims do not specify any particular ink sets other than by the 7 primary device dependent color space. This is a narrow specialization of U.S. Pat. No. 5,689,349 described above, except that no specific 7-color device dependent ink set is identified. In the specification, one embodiment is described that would utilize a set of extended inks beyond standard CMYK as Pantone Warm Red (an orange), Pantone Green PMS 347 (a mixture of standard cyan and standard yellow) and Pantone Blue PMS 293 (a mixture of standard cyan and a reflex blue colorant). This system claims to maintain near-neutral balance by utilizing the standard set of CMYK primaries and then enhances the gamut of that set by adding the yellow shade red (orange), a green and a red shade blue primary. In the present invention, only 5 primaries are required and the gamut of the 4 proposed primary colors is expanded beyond what is achievable using the 4 standard primary colors in this patent.

U.S. Pat. No. 5,892,891 describes a system for printing an extended gamut of colors by adding 2 or 3 colors to the standard CMYK ink set. It includes a mathematical process for predicting how much of the extended inks should be printed together with 3 of the CMYK inks so that there is never more than 4 inks involved in the marking of the substrate. So in essence, the invention here is the ability to take an image separated into 6 or 7 color space dimensions and reduce those 7 dimensions back down to no more than 4 dimensions. Again, this invention makes no requirements on the first set of inks, other than to refer to them as standard CMYK. Then using the invented algorithm, the print engine, a digital printing system such as an inkjet or electrophotographic engine will never drive more than 4 printing stations at one time. Since, the preferred embodiment, involves only 5 printing primaries, it is not necessary to restrict the number of printing stations.

Finally, U.S. Pat. No. 6,530,986 describes an aqueous ink set comprised of five chromatic inks and one black ink. The inks are not classified as to their device dependent color space. However, the ink set is defined by the hue name of the ink and by the colorant used in the inks. So they claim a cyan ink using any or mixtures of CI Pigment Blue 15:3, 15:4, 16, 76 or 79; a magenta ink using CI Pigment Red 122, 202, 207, 209 or CI Pigment Violet 19; a yellow ink using CI Pigment Yellow 74, 109, 110, 138 or 155; a green ink using one or both of CI Pigment Green 7 or 36; and an orange ink using CI Pigment Orange 34, 36, 43, 61, 64, or 71. These inks are intended for use in an inkjet printing system. However, most, if not all, of the colorants specified in U.S. Pat. No. 6,530, 986 are exotic and too expensive for either a publication or a packaging printing application.

To summarize, prior art methods and systems for expanding the color gamut do not adjust the primaries. Rather, they simply add additional process primaries. While this may seem useful in theory, in reality it is often difficult to find pigments that are readily available, and have useful properties, to use for the additional process primaries. Moreover, many such systems also add multiple additional process primaries, thus occupying too many printing stations.

What is needed in the art is a novel process printing ink set that avoids these and other problems of the prior art.

SUMMARY OF THE INVENTION

A method of extending the gamut of standard 4 color process printing is presented. The method thus yields various novel process printing ink sets. According to exemplary embodiments, an extended color gamut can be provided without requiring the addition of a sixth or seventh primary ink to the existing 4-color ink set. In some embodiments, an enhanced gamut can be achieved by changing the colors of the four basic primary inks and only adding a fifth primary ink. Using only five process inks thus provides, for example, the typical packaging printer with more open print stations for spot color printing or for overprint varnish application. In another illustrative embodiment, a sixth process color may be added to the inventive five color ink set.

DETAILED DESCRIPTION OF THE INVENTION

The present invention includes novel process ink sets to provide an extended color gamut. In some illustrative embodiments an extended color gamut can be provided without requiring the addition of a sixth or seventh primary ink to an existing 4-color ink set. In other illustrative embodiments, an enhanced gamut can be achieved by changing the colors of the four basic primary inks and only adding a fifth primary ink. These and other features of exemplary embodiments of the present invention are next described.

In exemplary embodiments of the present invention, the inks are preferably made from stable, non-fluorescent colorants and can be expected to provide stable neutral appearances and can be produced to be lightfast to exposure to normal light levels in stores, homes and even outdoor displays.

Exemplary embodiments of the present invention can be utilized in traditional packaging printing applications, such as, for example, those using offset, flexographic or gravure printing technology.

It is noted that many commercial printers (especially packaging printers) have presses that have no more than six printing stations. This is because the standard process primaries occupy four stations, and two stations are generally left available for printing custom brand or spot color inks, or for overprinting an image with a clear protective coating.

However, if a printer adopts a six color process set then there are no stations left with which to print a spot color or a special coating. Because the present invention requires only five print stations to achieve an extended color gamut, it has the commercial advantage of leaving open one print station, which can then be utilized for printing special colors or for applying a clear overprint varnish to protect the image underneath.

Figure 3:
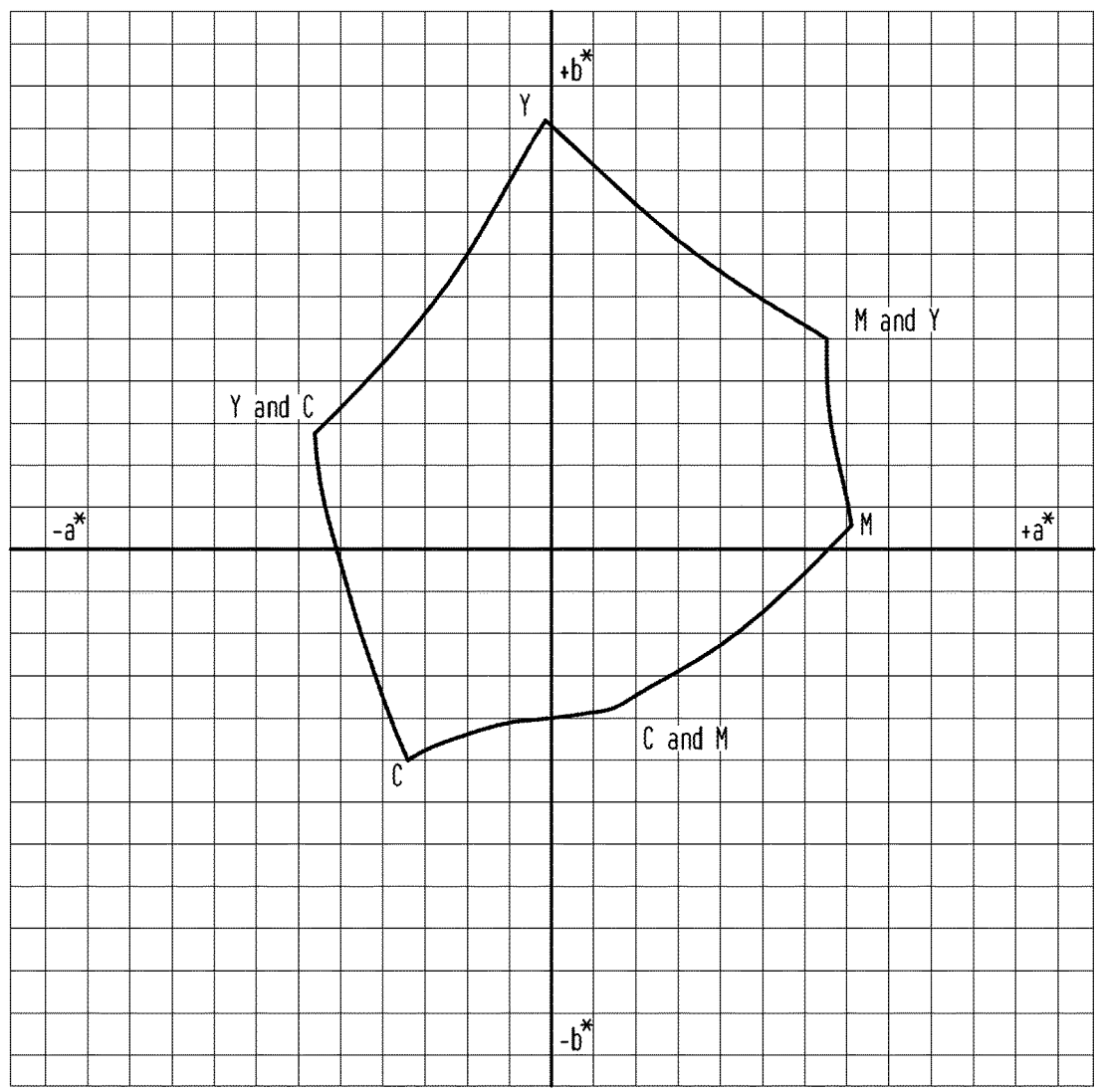
FIG. 3 shows a two-dimensional gamut projection onto a CIE CIELAB (a*,b*) diagram of the standard CMYK set of 4-color process primaries.

Conventionally, the most common set of primaries for four-color process printing are cyan, magenta, yellow and black. These colors have been documented and standardized by international agreement. According to these standards, the location of the color, and especially the hues of the primaries, are fixed. Thus, the cyan hue is given as CIELAB hue angle (measured from the horizontal a* axis) 234°±5°; the magenta hue angle is given as 356°±5°; and the yellow hue angle is given as 94°±5°. While this set of primaries can compose a reasonable gamut of reproducible colors, as shown in FIG. 3, it can be seen that the gamut is somewhat deficient in the regions where orange (50°), green (180°) and violet) (295°) are observed. It has thus been proposed that adding process primaries at or near to these locations will produce a larger or expanded gamut of colors.

However, such a suggestion would raise the number of process primaries from four to seven, which is untenable for standard six station setups, and obviates the possible use of a free sixth station. Thus, it has been a desire of the graphic reproduction industry to attempt to reduce the number of primaries from seven to a smaller number. To date, the only successful reductions have been from seven primaries to six primaries. There is still no standard set of extended color gamut primaries. It is noted that some commercial sets include the Pantone® Hexachrome® six-color set, the Hallmark® BigTop six-color set, Opaltone's seven color set and M Y Carton's FM6 seven color set (so called FM6 by ignoring the black printing station). Each of these technologies requires setting up and aligning either six or seven printing stations so that process printing with good registration can be performed in order to produce a range of colors in the neighborhood of the extra two or three primaries. However, in each of these cases, the intent of the extended ink set was to replace or eliminate the need for custom or spot-color inks by recreating those special colors by building them from overprints of the standard process colors with the additional extended gamut process colors. In general, the reproduction of images is thus maintained as a four-color process and the first four inks conform to the international standards for four-color process printing.

In exemplary embodiments of the present invention it is possible to reduce the number of inks from 6 to 5 color primaries by redefining the colors of the four-color process colors. Historically, such redefinitions were considered untenable because the techniques to produce a separation of an RGB image into CMYK plates relied on the inks being close to the international standard hue angles so that two-color and three-color overprints produced the expected secondary and tertiary colors. For example, U.S. Pat. No. 5,689,349, discloses a method and apparatus to map the original CMYK device dependent color space into a new device independent color space and then transform that to a second device independent color space, and finally into a second device dependent color space with the goal of allowing the printer to run an image with a selectively enhanced gamut. In particular, the final device dependent color space or ink set may be totally incapable of reproducing greens while expanding or enhancing the ability to reproduce browns.

In exemplary embodiments of the present invention, however, a gamut can be provided at least as great as the standard CMYK color space, and preferably much greater. There is a method of press calibration, known as near-neutral calibration, which asserts that overprints of the three colored inks (CMY) in the halftone proportion (50:40:40) should result in a color that has the same or very close to the same neutral appearance as a 50 halftone of the black ink. Such ink sets, as defined by U.S. Pat. No. 5,689,349, for example, would clearly be incapable of achieving this press or printing system calibration. In contrast, exemplary embodiments of the present invention are fully of capable of offering an enhanced gamut and still provide conformance to such near-neutral calibration requirements.

As noted above, conventionally an extended gamut process printing ink set is obtained by adding new primary inks to the process set. These inks can be, for example, two or more of the following: (i) orange or yellow-red, (ii) green, (iii) reddish blue and (iv) violet. Thus, a conventional fully extended gamut color set requires 5 or 6 color primaries in addition to a black primary. In exemplary embodiments of the present invention, the color of the four (4) basic primaries can be shifted away from the standard ink positions, and one or two inks can be added (for a total of 5-6 colors) to provide an equivalent or expanded gamut to the conventional extended 6 or 7 ink gamut, thus saving at least one, and possibly two, print stations on the press for other uses. This enables a printer or converter to extend the usefulness of existing pressroom equipment without the need to purchase additional print stations or a completely new press.

In a preferred embodiment of the present invention, the magenta primary can be shifted from its position in color space, from having a hue angle of a few degrees above 0 degrees to a hue angle well below 360 degrees, thus increasing the volume of violet colors that can be created by halftone overprinting. Also, the cyan primary can be shifted from its location near 234 degrees to a hue angle much greener, such as, for example, below 220 degrees, thus increasing the volume of green colors that can be create by halftone overprinting. Finally, the yellow primary may be optionally shifted slightly towards the green, thus moving the hue angle from the standard position just off of the yellow axis at 94 degrees to an angle greater than 95 degrees. This further enhances the gamut of green colors that can be reproduced by overprinting of the cyan and yellow primaries without needing to add the green primary described in the prior art.

FIGS. 1-7, next described, illustrate these and other features of exemplary embodiments of the present invention.

Figure 1:
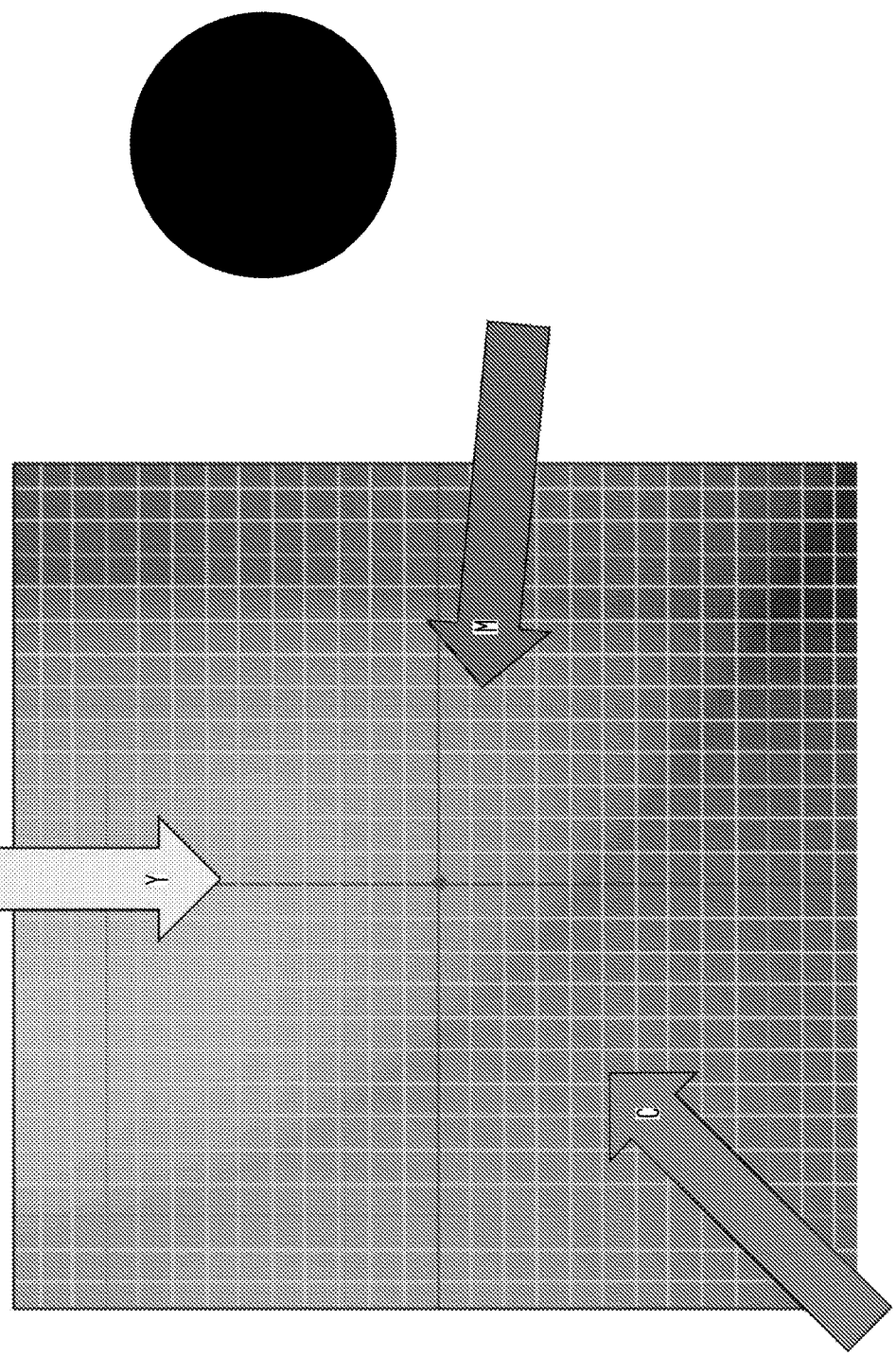
FIG. 1 illustrates the standard four color process printing set of cyan, magenta, yellow and black (CMYK), where CMY are shown as hue angles in CIELAB color space.
Figure 2:
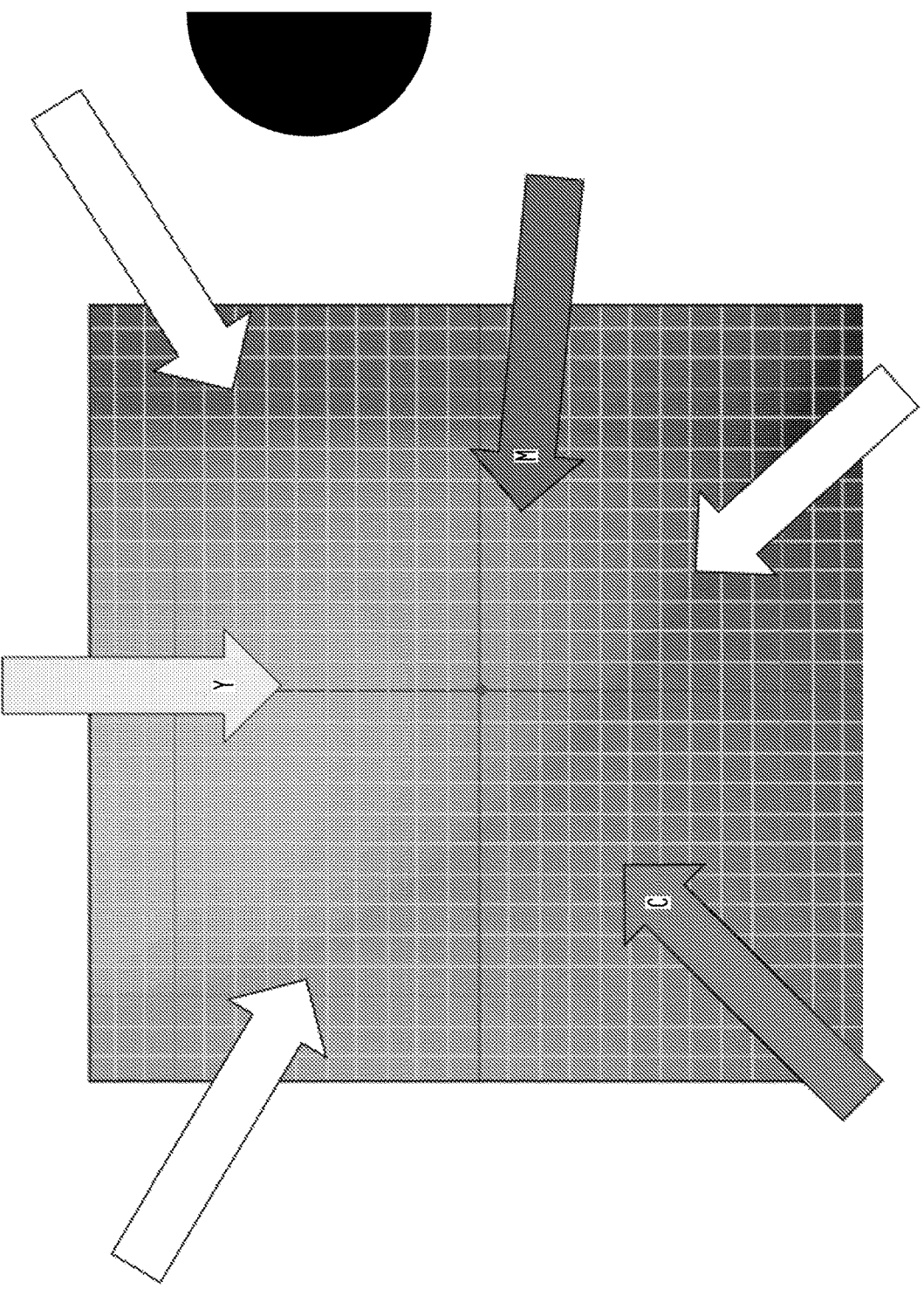
FIG. 2 illustrates conventional approaches to expanding the gamut of the standard CMY primaries shown in FIG. 1 by adding additional RGB primaries, as shown in the same CIELAB color space, with the RGB additional primaries positioned between each pair of CMY primaries, as shown.

FIGS. 1-2 illustrate prior art attempts to expand the color gamut of CMYK process printing. Starting from tri-stimulus values, one can mathematically convert to I a, b coordinates and display a color as, for example, a point in CIELAB colour space. FIG. 1 depicts such a 2D slice, and illustrates how for process printing the primary colours most normally used are cyan, magenta, yellow and black ("CMYK"). As shown in FIG. 1, CMY can be shown as hue angles in CIELAB colour space, and black is represented in FIG. 1 by the black circle to the right. The CMY primaries are appropriately labelled as "C", "M" and "Y." As noted above, for standard four colour process printing the gamut is limited, and one could increase the gamut by adding more colours. The question is—where to add them.

FIG. 2 illustrates the conventional Opaltone™ approach, referred to above, which is to add additional RGB primaries spaced in between the standard CMY hues, as shown. The problem with this conventional approach is that although it may seem appealing in theory, in practice there are often no pigments readily available to implement the additional RGB primaries as shown. For example, at the hues shown for the additional RGB primaries in FIG. 2, only one option for green exists (to be interspersed between C and Y), and it, Pigment Green 7, has low colour strength per unit pigment weight. This is because Pigment Green 7 has four Chlorine atoms on each of its four outer benzene rings. Similarly, there is no obvious option for a clean reflex blue shade pigment interspersed between the C and M primaries.

Thus, in exemplary embodiments of the present invention, in order to add additional process primaries so as to expand the color gamut, the existing primaries need to be first shifted in the color space, and then one or two suitable additional process primaries can be added, for which pigments are readily available, with acceptable properties, such as properties similar to the various pigments used for the standard unshifted CMY hues and additional process primaries.

FIG. 3 similarly shows a two-dimensional gamut projection onto the CIE CIELAB (a*, b*) diagram of the same standard set of 4-color process primaries, CMYK. The location of the cyan, magenta and yellow primaries are noted along with the 2-color overprint colors C&M, which appears blue, M&Y, which appears red, and Y&C, which appears green. FIG. 3 thus shows the 2D projection of the gamut of standard 4-color process printing inks.

Figure 4:
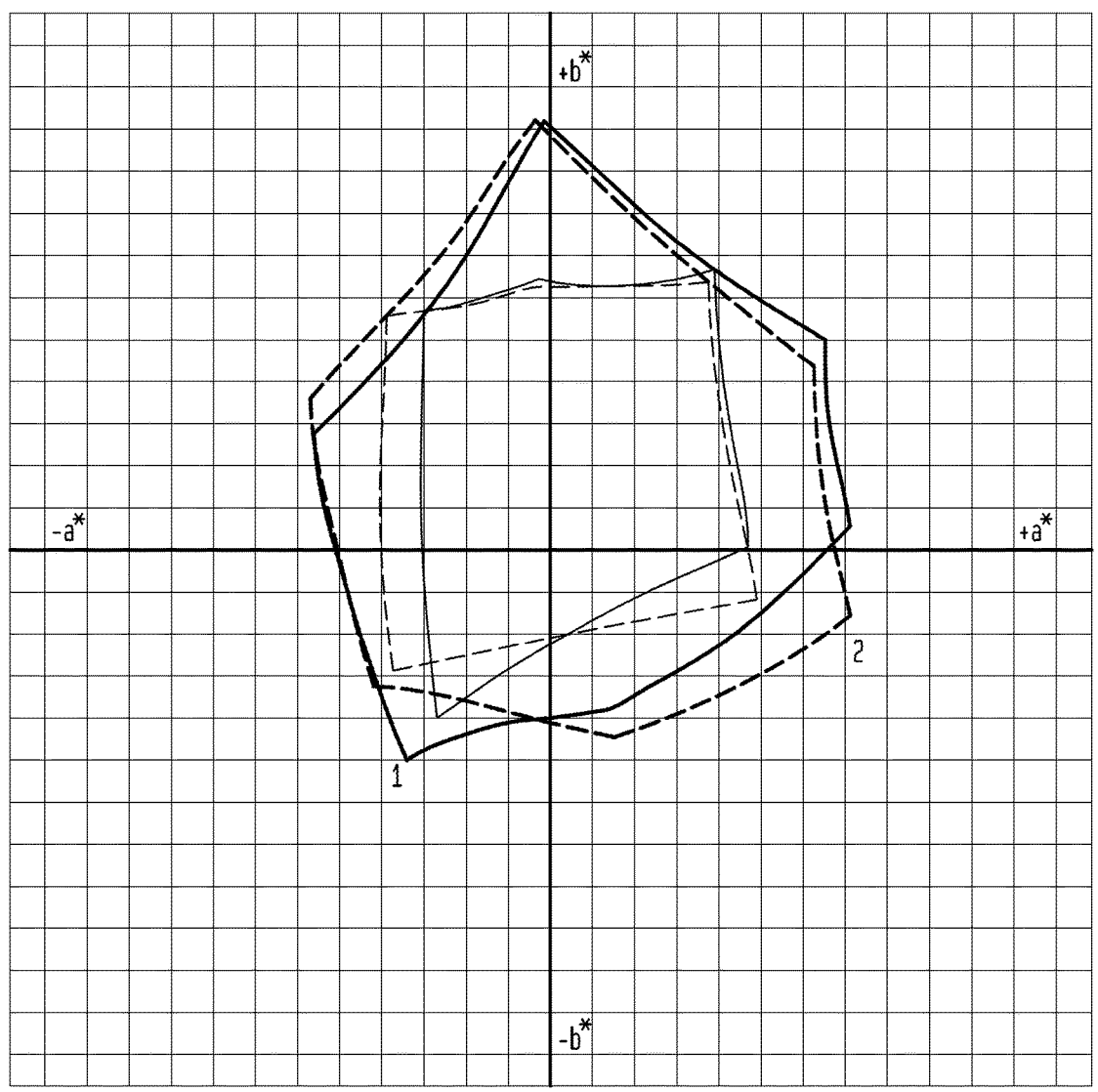
FIG. 4: shows a two-dimensional gamut projection onto the CIE CIELAB (a*,b*) diagram of each of (i) the standard set of 4-color process primaries, and (ii) a novel set of new 4-color process primaries according to an exemplary embodiment of the present invention.

FIG. 4 shows a two-dimensional gamut projection onto the CIE CIELAB (a*, b*) diagram of both the standard set of 4-color process primaries and the novel set of new 4-color process primaries. The smaller gamuts inside of the projected gamuts are the gamuts at a medium lightness level, equivalent to a CIE metric lightness L* of 60 units. The standard gamut is shown in the dark (black) lines and the new gamut is shown in the lighter (white) lines. FIG. 4 shows the 2D projection of the gamut of the preferred embodiment set of 4-color process printing inks compared to the standard 4-color set. As can be seen, the shift of the yellow primary to the green and the magenta primary to the blue results in a smaller gamut of red and orange colors. Therefore in some exemplary embodiments of the present invention it is preferred to add a reddish orange primary color to the four process colors to gain back the red colors and to enhance the orange colors and the yellowish orange colors produced by halftone overprinting of the magenta and orange primaries or halftone overprinting of the orange and yellow primaries.

Figure 5:
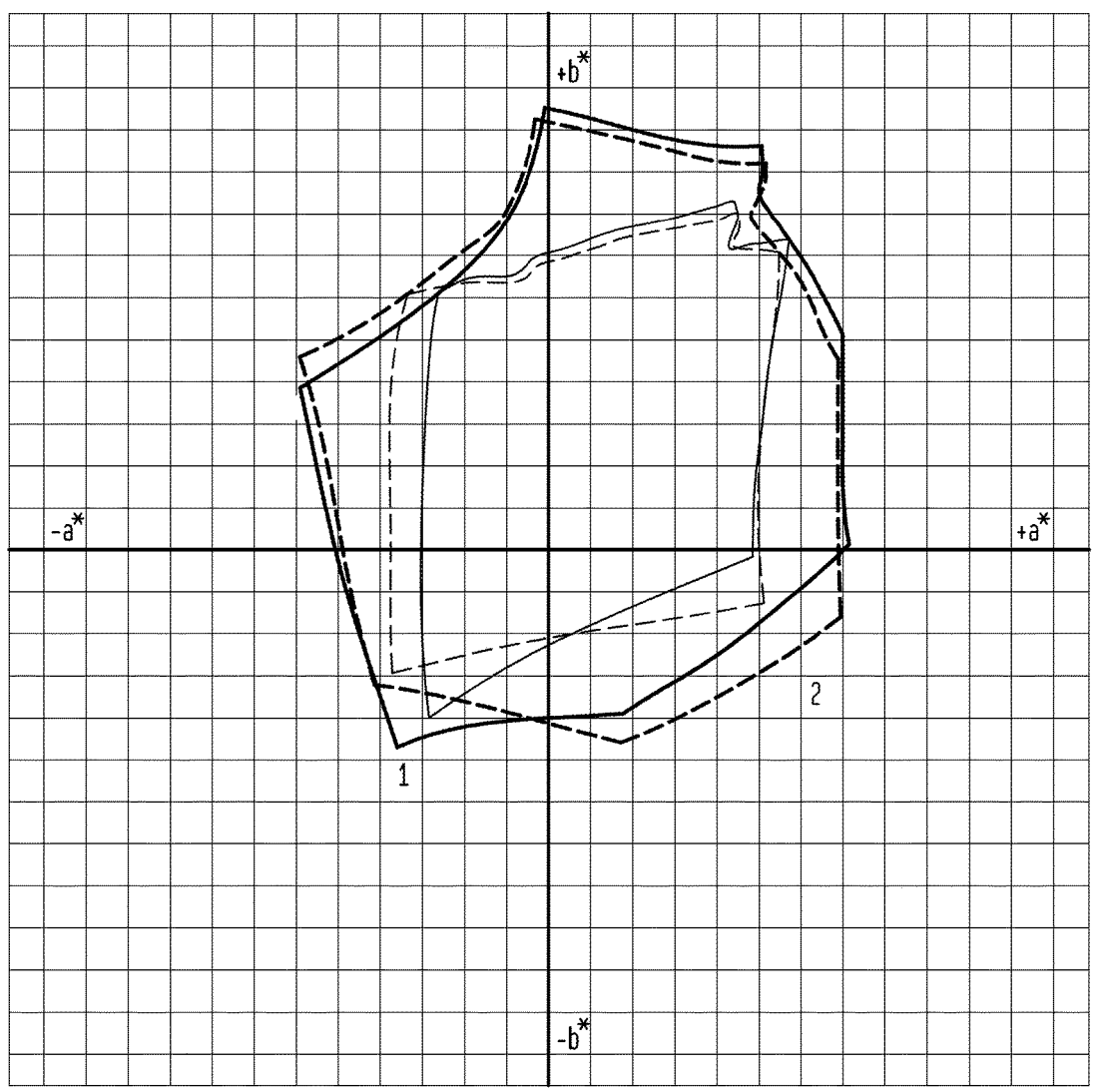
FIG. 5: shows a two-dimensional gamut projection onto a CIE CIELAB (a*,b*) diagram of the standard CMYK primary inks plus an orange ink (dark lines) as well as the inventive 4-color process primaries plus the same orange ink (light lines) for the full gamut projection and for the L* of 60 units projection.

FIG. 5 shows the two-dimensional gamut projection onto the CIE CIELAB (a*, b*) diagram of the standard CMYK primary inks plus an orange ink (dark lines), as well as the inventive 4-color process primaries plus the same orange ink (light lines) for each of the full gamut projection and the L* of 60 units projection. FIG. 5 thus shows the 2D projected gamut of a preferred exemplary embodiment set of 5-color process printing inks.

Figure 6:
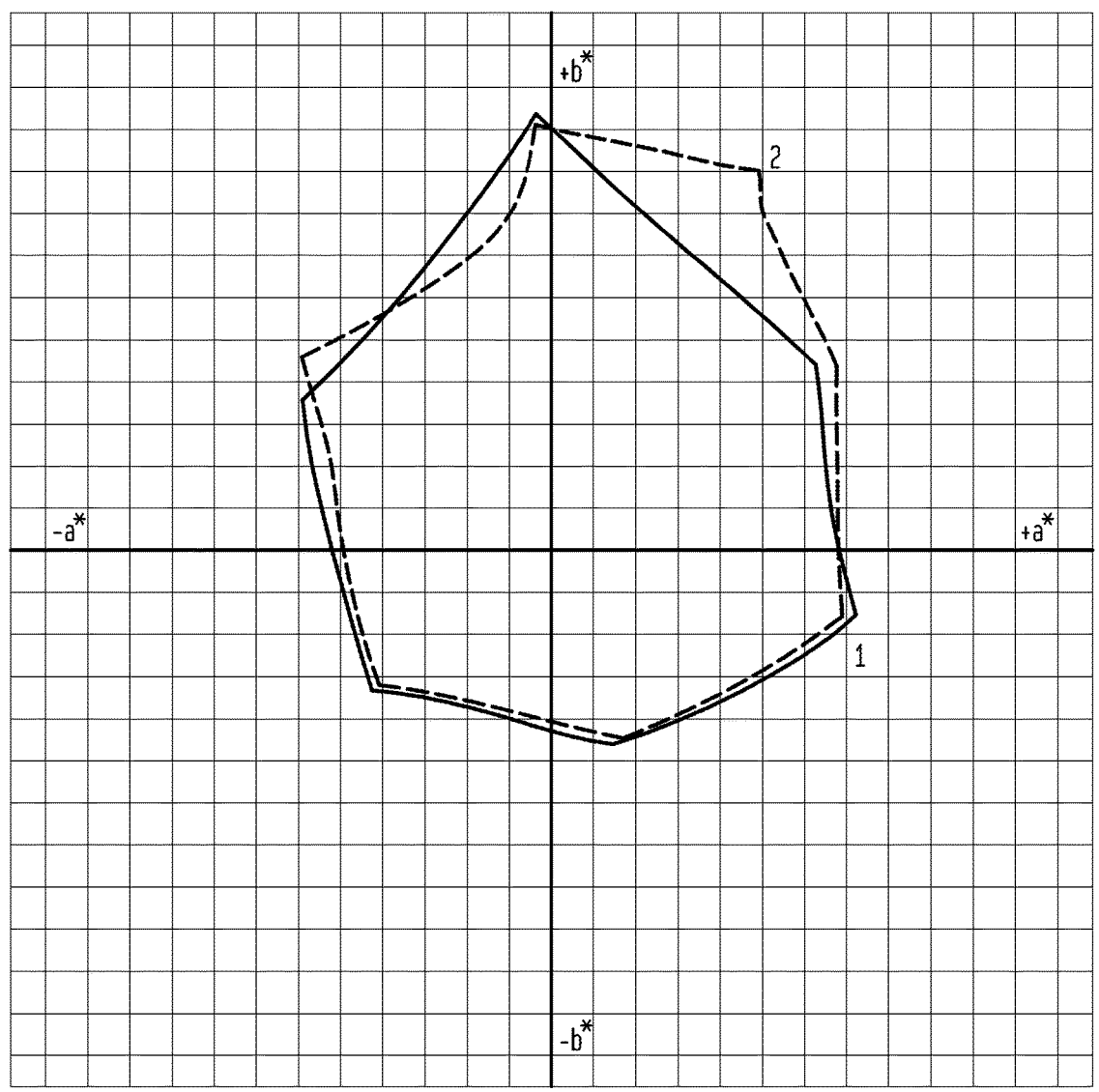
FIG. 6: shows a two-dimensional gamut projection onto a CIE CIELAB (a*,b*) diagram of the novel 4-color process primaries as well as the same set with the addition of the orange primary, thus showing how the addition of the orange primary compensates for the shift of the yellow and magenta primaries to new hues.

FIG. 6 shows the two-dimensional gamut projection onto the CIE CIELAB (a*, b*) diagram of the novel 4-color process primaries and the same set with the addition of the orange primary. This shows how the addition of the orange primary compensates for the shift of the yellow and magenta primaries to new hues, as described above.

Figure 7:
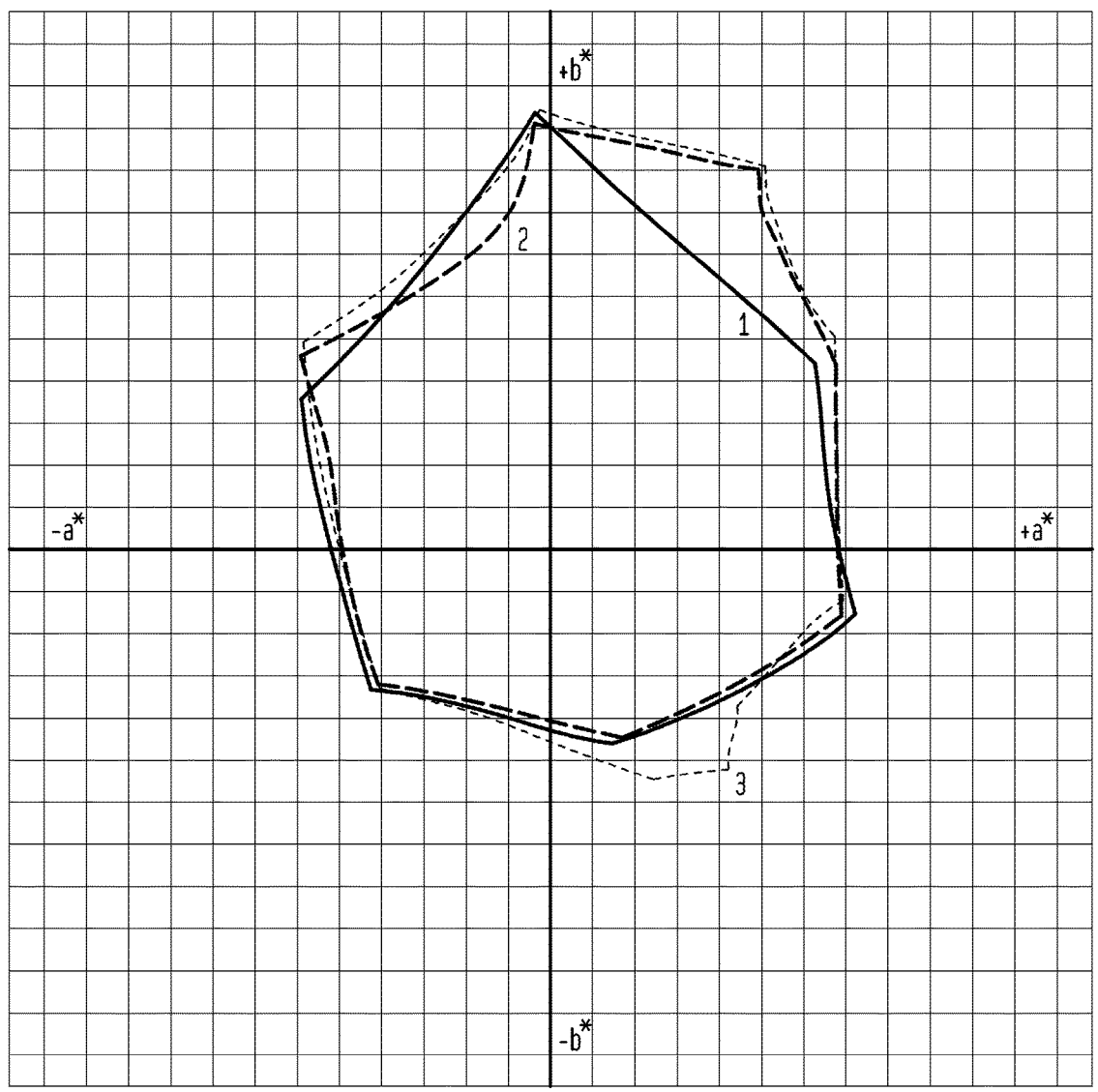
FIG. 7: shows the two-dimensional gamut projection onto the CIE CIELAB (a*,b*) diagram of the novel 4-color process primaries, orange primary and a violet primary.

Finally, FIG. 7 shows the two-dimensional gamut projection onto the CIE CIELAB (a*, b*) diagram of the novel 4-color process primaries, an orange primary and a violet primary. The addition of the violet primary can further expand the gamut at the cost of requiring 6 print stations. This gains that small horn of colors around the location in color space of the violet primary.

In a preferred exemplary embodiment, an ink set of the present invention would be used for flexographic printing, especially for the printing of flexographic packaging materials. However, it is understood that the ink set of the present invention is not limited to this application area, and could thus be used in virtually any area where process printing is practiced. This includes, but is not limited to, gravure, lithographic, ink jet, screen, etc., and is also meant to encompass processing of solvent-based inks, water-based inks, oxidation drying inks, energy curable inks, etc.

Furthermore, there is no limitation to the order in which the ink set of the present invention could be applied, and it is understood that exemplary individual inks could be applied in virtually any order and still be within the scope of the present invention.

It is understood that while various exemplary embodiments of the present invention have been expressed in the CIELAB color space, they could have just as well been expressed in any system for designating and quantifying hue. Thus, the novel shifts of primary hues, and the newly added process primaries, as described above and in the examples below, described using the CIELAB color space are understood to be exemplary, and any equivalent expressions of hues and shifts of hue, in any other known color system are understood to be fully within the scope of the invention. The invention is thus understood to not be limited to expression in any one color system.

EXAMPLES

The following are illustrative examples highlighting specific aspects of some exemplary embodiments of the present invention. It is understood that they do not limit the scope thereof, and are merely illustrative.

Using the standard ink set and printing an ANSI IT817.4 test chart, the volume of a process printing set can be determined. The CMYK inks are printed both as single color series of tone steps and as two and three color overprint tones and the CIELAB L*a*b* coordinates read using a commercial print characterization instrument and software. Based on the measurement data, the standard CMYK ink set will encompass a volume of approximately 308,702 cubic CIELAB units. Using the same chart and analysis process, a preferred exemplary embodiment according to the present invention will produce a gamut of 315,995 cubic CIELAB units, a 2.3% increase in color gamut. With the addition of a reddish orange primary, the gamut with the new primaries increases to 374,061 cubic CIELAB units, while the addition of a orange primary to the standard CMYK ink sets yields a gamut of only 365,275 cubic CIELAB units. Thus the inventive ink set realizes a gain of nearly 10,000 cubic CIELAB units, which is a gain of the same 2.4%. Thus the increase in gamut due to the rotation of the primaries is carried through to each succeeding primary set, whether it arises from adding an orange, a blue or a violet fifth or sixth additional primary color.

For testing purposes, prints were prepared using the following protocol. The CMYK inks were printed on a flexographic central impression press, printing water-based inks on paperboard at 100 m/min, both as single colors and as and two and three color overprints, printing a set of TC1860-CMYK_Eye-One_iO Gretag Macbeth test-charts. These charts were read using an Xrite it automatic chart reading spectrophotometer. The output data was transformed into an ICC profile using CoPrA ColorLogic software. ICC profiles for different process printing sets were compared using DocBees Profile Manager software. This gave an output for the total gamut volume, measured as cubic CIELAB units, and also the facility to compare the gamut shape, either in 2 dimensions (a*, b* plots at different L values) or in 3 dimensional L*, a*, b* space. The same type of chart was produced, but adapted for 5 and 6 color printing, and the same analysis process to produce gamuts for 5 and 6 color process sets.

As noted above, the ink sets according to exemplary embodiments of the present invention are not limited to this (or any one) process and could be used in virtually any print application where process printing is practiced.

For testing purposes, the CMYK inks that were used as the standard four color process set had the pigment color index numbers: PB15:3, PR57:1, PY13 and PBk7. An example of the inventive four color process set uses the pigment color index numbers: PB79, PR122, PY74, PBk7. An example of the new five color process set uses the pigment color index numbers: PB79, PR122, PY74, PBk7 and PO34. An example of the new six color process set uses the pigment color index numbers: PB79, PR122, PY74, PBk7, PO34 and PV23. It should be noted that the examples of standard four color process sets as well as the examples of ink sets of the present invention are not limited to these colorants and could incorporate other colorants that meet the prescribed color coordinates. The colorant, could be pigment or a dye. Pigments include organic and inorganic pigments, dyes include natural and synthetic dyes, including but not limited to acid dyes, basic dyes, mordant dyes, vat dyes, azoic dyes, food dyes and sublimation dyes.

As noted above, FIGS. 6 and 7 show how a 5-color print can produce an enhanced or more realistic appearance in a printed image by printing a larger gamut of colors. This is often highly desirable in flexographic printing on papers where the substrate may reduce the achievable gamut of a standard 4-color process ink set.

The present invention has been described in detail, including various exemplary and preferred embodiments thereof. However, it will be appreciated that those skilled in the art, upon consideration of the present disclosure, may make modifications and/or improvements on this invention that fall within the scope and spirit of the invention.

What is claimed is:

1. A method of extending the color gamut of a 4-color process printing ink set having cyan, magenta, yellow and black primaries, comprising:
   shifting at least two of the cyan, magenta and yellow primaries,
      wherein the cyan is shifted from a hue angle near 234 degrees to a hue angle less than about 220 degrees, and
      wherein the magenta primary is shifted from a hue angle of a few degrees above 0 degrees to a hue angle less than 355 degrees, and
      wherein the yellow primary is shifted from a hue angle of 94 degrees to a hue angle greater than 95 degrees; and
   adding at least one additional primary process color.

2. The method of claim 1, wherein said shifting at least one of the cyan, magenta and yellow primaries includes one or more of:
   shifting the cyan primary to a greener-shade of cyan,
   shifting the magenta primary to a bluer-shade of magenta, and
   shifting the yellow primary to a greener-shade of yellow.

3. The method of claim 1, wherein the at least one additional primary process color is a reddish orange color.

4. The method of claim 3, wherein the reddish orange color has a CIELAB metric hue angle of between about 49 and about 59 degrees.

5. The method of claim 1, wherein the at least one additional primary process color is a reddish blue color.

6. The method of claim 5, wherein the reddish blue color has a CIELAB metric hue angle of between about 305 and about 315 degrees.

7. The method of claim 1, wherein two additional primary process colors are added.

8. The method of claim 7, wherein said two colors comprise a reddish orange color and a reddish blue color.

9. The method of claim 8, wherein the reddish orange color has a CIELAB metric hue angle of between about 49 and about 59 degrees, and the reddish blue color has a CIELAB metric hue angle of between about 305 and about 315 degrees.

10. A printing process using a printing ink set generated using the methods of claim 1.

11. The printing process of claim 10, wherein the printing process includes at least one of flexographic, gravure, lithographic, screen, and ink jet.

12. The printing process of claim 10, wherein the inks used are one or more of solvent-based inks, water-based inks, oxidation drying inks, and energy curable inks.

13. The method of claim 1, wherein the primaries or additional process colors are shifted an equivalent amount as expressed in any color system different than CIELAB.

14. A printing process using a printing ink set generated using the methods of claim 13.

15. The printing process of claim 14, wherein the printing process includes at least one of flexographic, gravure, lithographic, screen, and ink jet.

16. The printing process of claim 15, wherein the inks used are one or more of solvent-based inks, water-based inks, oxidation drying inks, and energy curable inks.

* * * * *